(12) United States Patent
Egawa

(10) Patent No.: US 7,560,302 B2
(45) Date of Patent: Jul. 14, 2009

(54) SEMICONDUCTOR DEVICE FABRICATING METHOD

(75) Inventor: Yoshimi Egawa, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 248 days.

(21) Appl. No.: 11/723,526

(22) Filed: Mar. 20, 2007

(65) Prior Publication Data
US 2007/0231966 A1 Oct. 4, 2007

(30) Foreign Application Priority Data
Mar. 31, 2006 (JP) .............................. 2006-098384

(51) Int. Cl.
H01L 21/44 (2006.01)

(52) U.S. Cl. ................. 438/106; 438/109; 438/113; 257/E21.511

(58) Field of Classification Search ................. 438/106, 438/109, 113
See application file for complete search history.

(56) References Cited

U.S. PATENT DOCUMENTS
2008/0230923 A1* 9/2008 Jo et al. ..................... 257/777

FOREIGN PATENT DOCUMENTS
JP 2004296812 10/2004

* cited by examiner

Primary Examiner—Jack Chen
(74) Attorney, Agent, or Firm—Volentine & Whitt, PLLC

(57) ABSTRACT

To improve the fabrication yield of semiconductor devices. A semiconductor device where a desired number of semiconductor chips are laminated in the thickness direction thereof is fabricated by repeating, an arbitrary number of times such as one time or two or more times, a step of bonding and mounting another support substrate laminate on first bumps exposed by separating and removing one support substrate from a support substrate laminate composite where second bumps of two support substrate laminates including plural semiconductor wafers mounted on support substrates have been made to face each other and are electrically connected.

5 Claims, 14 Drawing Sheets

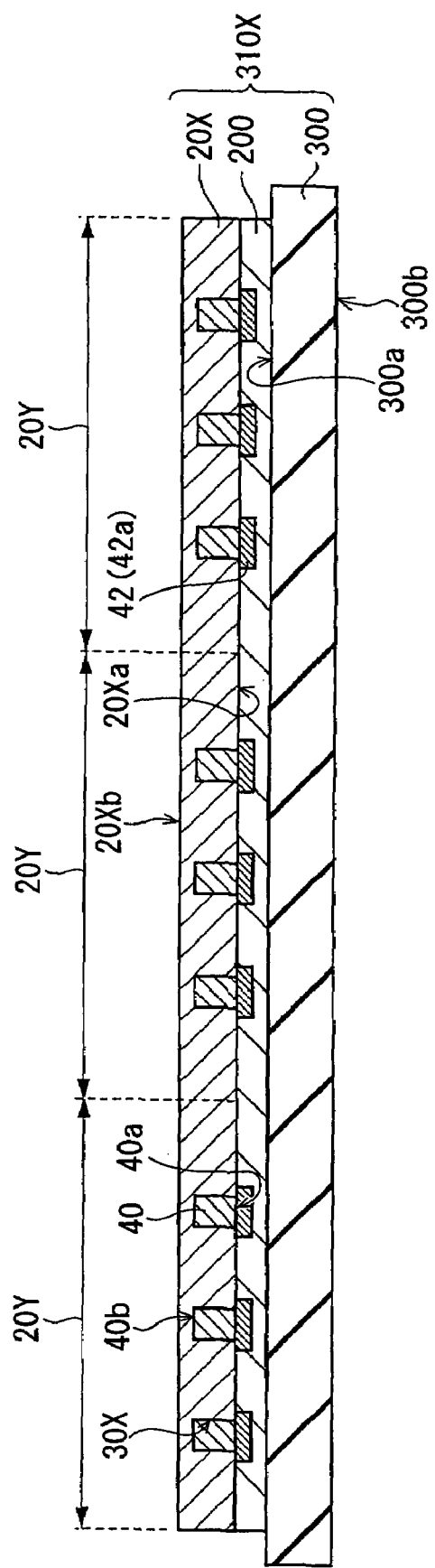

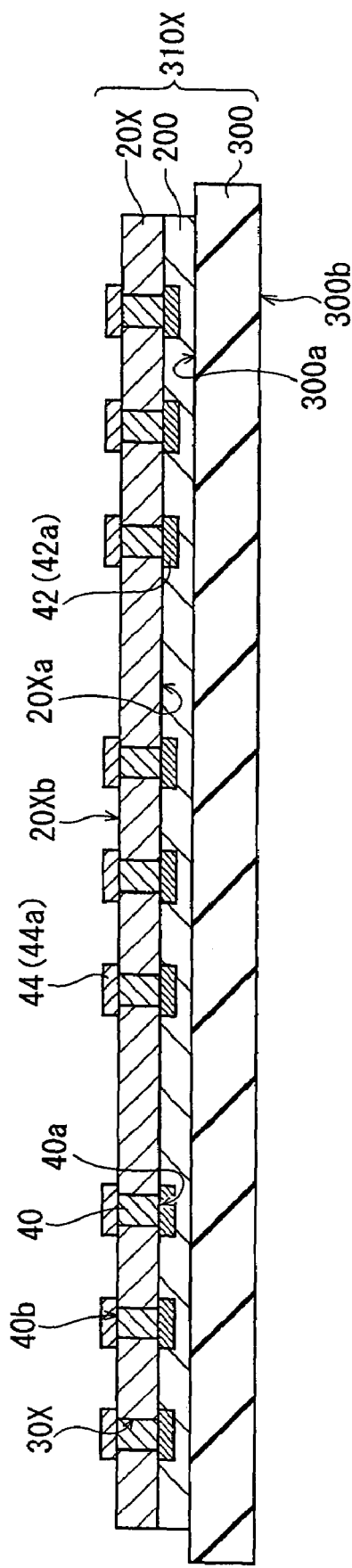

SEMICONDUCTOR DEVICE FABRICATING METHOD

CROSS-REFERENCE TO RELATED APPLICATION

This application claims priority under 35 USC 119 from Japanese Patent Application No. 2006-098384, the disclosure of which is incorporated by reference herein.

BACKGROUND OF THE INVENTION

1. Field of the Invention

The present invention relates to a semiconductor device fabricating method, and in particular to a semiconductor device fabricating method where semiconductor chips having a plurally lamentable configuration are plurally laminated.

2. Description of the Related Art

A semiconductor chip laminate package is known where plural semiconductor chips are laminated with the purpose of multifunctionalizing a semiconductor device.

As one example of such a semiconductor chip laminate package, there is a stacked multichip package. A stacked multichip package has a configuration where plural semiconductor chips are superposed and mounted on a substrate.

Among methods of fabricating such a multichip package, a semiconductor device fabricating method is known which comprises the steps of: forming first electrode lead-out pads on chip regions of a first semiconductor wafer and forming first conductive posts exposed from the front surface of the first semiconductor wafer on the first electrode lead-out pads to form a first semiconductor wafer, forming second electrode lead-out pads on chips regions of a second semiconductor wafer, forming second conductive posts exposed from the front surface of the second semiconductor wafer on the second electrode lead-out pads, and forming, in the back surface of the second semiconductor wafer, holes in positions facing the second conductive posts by etching or lasering to form a second semiconductor wafer whose second electrode lead-out pads are exposed; and disposing the second semiconductor wafer face-up on the first semiconductor wafer, inserting the first conductive posts into the holes, and connecting the first conductive posts to the second electrode lead-out pads (e.g., see Japanese Patent Application Publication (JP-A) No. 2004-296812).

According to conventionally known fabricating methods such as the semiconductor device fabricating method of JP-A No. 2004-296812, there is the potential for warpage to occur in the semiconductor chips or for the semiconductor chips themselves to break when, for example, the semiconductor chips are laminated. As a result, there is the potential for defects (open defects) in the electrical connections between the semiconductor chips resulting from warpage and breakage of the semiconductor chips to occur.

SUMMARY OF THE INVENTION

The present invention has been made in view of this problem. In order to address this problem, an aspect of a semiconductor device fabricating method of the present invention includes the following steps.

That is, these steps are: (a) preparing plural semiconductor wafers, each of which includes a first main surface, a second main surface that opposes the first main surface, plural chip regions set in a matrix on the first main surface, precursor through holes that open to the first main surface, embedded electrodes that are embedded in the precursor through holes and include first top surfaces exposed to the first main surface, and first wiring layers that are disposed on the first main surface inside the chip regions and electrically connected to the first top surfaces of the embedded electrodes;

(b) mounting the first main surfaces of the plural semiconductor wafers on front surfaces of plural support substrates, each of which includes a front surface and a back surface that opposes the front surface, and adhering the first main surfaces to the front surfaces with an adhesive to form plural precursor support substrate laminates;

(c) polishing second main surface sides of the precursor support substrate laminates to expose second top surfaces of the embedded electrodes;

(d) forming, on the second main surfaces, second wiring layers disposed electrically connected to the second top surfaces of the embedded electrodes;

(e) cutting the semiconductor wafers along boundary lines of the plural chip regions and polishing, without cutting, the support substrates to form plural support substrate laminates including plural semiconductor chips;

(f) electrically interconnecting and laminating the second wiring layers of two of the support substrate laminates to form a support substrate laminate composite;

(g) separating and removing either one of the support substrates of the two support substrates of the support substrate laminate composite to expose the first wiring layers;

(h) electrically connecting the second wiring layers of the other support substrate laminate to the exposed first wiring layers of the support substrate laminate composite and mounting the second wiring layers on the exposed first wiring layers;

(i) separating and removing either one of the support substrates of the two support substrates of the support substrate laminate composite to expose the first wiring layers;

(j) preparing plural precursor mounting substrates, each of which includes a front surface, a back surface that opposes the front surface, precursor mounting substrate through holes that open to the front surface, and mounting substrate embedded electrodes that are embedded in the precursor mounting substrate through holes and include first top surfaces exposed to the front surface;

(k) electrically connecting the first top surfaces of the mounting substrate embedded electrodes of the precursor mounting substrates to the exposed first wiring layers of the support substrate laminate composite and mounting the first top surfaces on the exposed first wiring layers;

(l) separating and removing the support substrates of the support substrate laminate composite;

(m) exposing the exposed first wiring layers and injecting resin into gaps between the plural semiconductor chips and from end edge sides of the mounting substrate to form a first sealing portion;

(n) forming a second sealing portion that seals the exposed first wiring layers and the first sealing portion;

(o) polishing the back surface sides of the precursor mounting substrates to expose second top surfaces of the mounting substrate embedded electrodes and form a mounting substrate;

(p) forming external terminals on the second top surfaces of the exposed mounting substrate embedded electrodes; and (q) cutting and dicing the first sealing portion, the second sealing portion, and the mounting substrate along boundary lines of the plural chip regions.

According to the semiconductor device fabricating method of the present invention, the polishing step, the laminating step, and the sealing step can be performed in a state where wafers where semiconductor chips are plurally formed or diced semiconductor chips are supported by a support substrate, so that the occurrence of warpage that had conventionally arisen in semiconductor chips due to the fabrication process is prevented, the essential planarity is maintained, further thinning of the wafers (semiconductor chips) is realized, and breakage of the wafers or semiconductor chips in the process can be effectively prevented.

Consequently, electrical connections can be made better. Further, the fabrication yield of the semiconductor device to be fabricated can be improved even more.

In addition, according to the semiconductor device fabricating method of the present invention, the laminating step and the sealing step can be performed in a state where the thickness of the wafers is maintained, so that handling the structures during fabrication is extremely easy. Further, existing facilities can be used without any modification thereof, so that a reduction in the fabrication cost becomes possible.

Moreover, in the dicing step, the dicing step can be performed without having to use dicing tape or dicing rings, so that a further reduction in the fabrication cost becomes possible.

Further, in a second aspect of the present invention, there is provided a semiconductor device fabricating method comprising:

(a) preparing plural semiconductor wafers, each of which includes a first main surface, a second main surface that opposes the first main surface, plural chip regions set in a matrix on the first main surface, precursor through holes that open to the first main surface, embedded electrodes that are embedded in the precursor through holes and include first top surfaces exposed to the first main surface, and first wiring layers that are disposed on the first main surface inside the chip regions and electrically connected to the first top surfaces of the embedded electrodes;

(b) mounting the first main surfaces of the plural semiconductor wafers on front surfaces of plural support substrates, each of which includes a front surface and a back surface that opposes the front surface, and adhering the first main surfaces to the front surfaces with an adhesive to form plural precursor support substrate laminates;

(c) polishing second main surface sides of the precursor support substrate laminates to expose second top surfaces of the embedded electrodes;

(d) forming, on the second main surfaces, second wiring layers disposed electrically connected to the second top surfaces of the embedded electrodes;

(e) cutting the semiconductor wafers along boundary lines of the plural chip regions and polishing, without cutting, the support substrates to form plural first support substrate laminates including plural semiconductor chips and cutting and polishing the semiconductor wafers and the support substrates along boundary lines of the plural chip regions to form plural second support substrate laminates including a single semiconductor chip;

(f) electrically interconnecting the second wiring layers of the first support substrate laminates and the second wiring layers of the second support substrate laminates to form a support substrate laminate composite;

(g) separating and removing the support substrates of the second support substrate laminates of the support substrate laminate composite to expose the first wiring layers;

(h) electrically connecting the second wiring layers of the other second support substrate laminates to the exposed first wiring layers of the support substrate laminate composite and mounting the second wiring layers on the exposed first wiring layers;

(i) separating and removing the support substrates of the second support substrate laminates of the support substrate laminate composite to expose the first wiring layers;

(j) preparing plural precursor mounting substrates, each of which includes a front surface, a back surface that opposes the front surface, precursor mounting substrate through holes that open to the front surface, and mounting substrate embedded electrodes that are embedded in the precursor mounting substrate through holes and include first top surfaces exposed to the front surface;

(k) electrically connecting the first top surfaces of the mounting substrate embedded electrodes of the precursor mounting substrates to the exposed first wiring layers of the second support substrate laminates of the support substrate laminate composite and mounting the first top surfaces on the exposed first wiring layers;

(l) separating and removing the support substrates of the first support substrate laminates of the support substrate laminate composite;

(m) exposing the exposed first wiring layers of the support substrate laminates of the support substrate laminate composite and injecting resin into gaps between the plural semiconductor chips and from end edge sides of the mounting substrates to form a first sealing portion;

(n) forming a second sealing portion that seals the exposed first wiring layers and the first sealing portion;

(o) polishing the back surface sides of the precursor mounting substrates to expose second top surfaces of the mounting substrate embedded electrodes and form a mounting substrate;

(p) forming external terminals on the second top surfaces of the exposed mounting substrate embedded electrodes; and (q) cutting and dicing the first sealing portion, the second sealing portion, and the mounting substrate along boundary lines of the plural chip regions.

In the second aspect of present invention, (h) and (i) may be repeatedly performed one or two or more times after (g).

The precursor mounting substrates may comprise interposers where the height of the mounting substrate embedded electrodes in the thickness direction of the precursor mounting substrates is in the range of 50 μm to 200 μm.

Further, the support substrates may comprise heat-resistant glass substrates.

In a third aspect of the invention, there is provided a semiconductor device fabricating method when fabricating a semiconductor device where plural semiconductor chips are electrically connected, laminated, and sealed, the method comprising:

preparing a precursor mounting substrate where plural laminates where plural semiconductor chips are laminated are mounted, with the precursor mounting substrate including a front surface, a back surface that opposes the front surface, precursor mounting substrate through holes that open to the front surface, and mounting substrate embedded electrodes that are embedded in the precursor mounting substrate through holes and include first top surfaces exposed to the front surface;

injecting resin into gaps between the laminates of the plural semiconductor chips and from end edge sides of the mounting substrate to form a sealing portion;

polishing the back surface side of the precursor mounting substrate to expose second top surfaces of the mounting substrate embedded electrodes and form a mounting substrate; and polishing and dicing the sealing portion and the mounting substrate.

In the third aspect of the invention, the precursor mounting substrate may comprise an interposer where the height of the mounting substrate embedded electrodes in the thickness direction of the precursor mounting substrate is in the range of 50 μm to 200 μm.

Further, in a fourth aspect of the present invention, there is provided a semiconductor device fabricating method when fabricating a semiconductor device where plural semiconductor chips are electrically connected, laminated, and sealed, the method comprising:

forming plural precursor support substrate laminates by mounting, on front surfaces of plural support substrates each of which includes a front surface and a back surface that opposes the front surface, first main surfaces of plural semiconductor wafers, each of which includes a first main surface, a second main surface that opposes the first main surface, plural chip regions set in a matrix on the first main surface, precursor through holes that open to the first main surface, embedded electrodes that are embedded in the precursor through holes and include first top surfaces exposed to the first main surface, and first wiring layers that are disposed on the first main surface inside the chip regions and electrically connected to the first top surfaces of the embedded electrodes, and adhering the first main surfaces to the front surfaces with an adhesive;

polishing a second main surface side of the precursor support substrate laminate to expose second top surfaces of the embedded electrodes; and forming, on the second main surfaces, second wiring layers disposed electrically connected to the second top surfaces of the embedded electrodes.

In the fourth aspect of the invention, the support substrates may comprise heat-resistant glass substrates.

BRIEF DESCRIPTION OF THE DRAWINGS

Preferred exemplary embodiments of the present invention will be described in detail based on the following figures, wherein:

FIG. 2 is a schematic diagram showing the cross section of a structure during fabrication;

FIG. 3 is a schematic diagram showing the cross section of the structure during fabrication;

DETAILED DESCRIPTION OF THE INVENTION

Figure 1A:
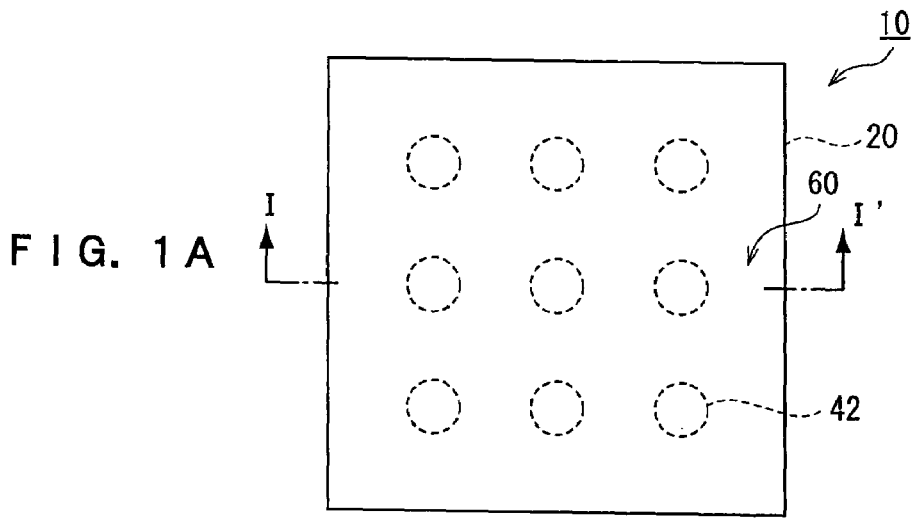
FIG. 1A is a schematic plan diagram showing a semiconductor device as seen from the top surface side.

An embodiment of the present invention will be described below with reference to the drawings. It will be noted that the shapes, sizes, and dispositional relationships of constituent parts are only schematically shown in the drawings to an extent that this invention can be understood, and thus the invention should not be construed as being limited to these. Further, although specific materials, conditions, and numerical value conditions are used in the following description, these constitute nothing more than one preferred example, and consequently the invention should not be construed as being limited to these.

It will also be noted that the semiconductor chip of the present invention and the semiconductor device of the present invention where semiconductor chips are laminated can in principle be formed by a conventionally known fabrication process using conventionally known materials. Consequently, sometimes this will be noted and detailed description of these will be omitted.

First Embodiment (Configuration of Semiconductor Device)

First, an example of the configuration of a semiconductor device fabricated by a semiconductor device fabricating method of a first embodiment of the present invention will be described with reference to FIG. 1A to FIG. 1C.

Figure 1B:
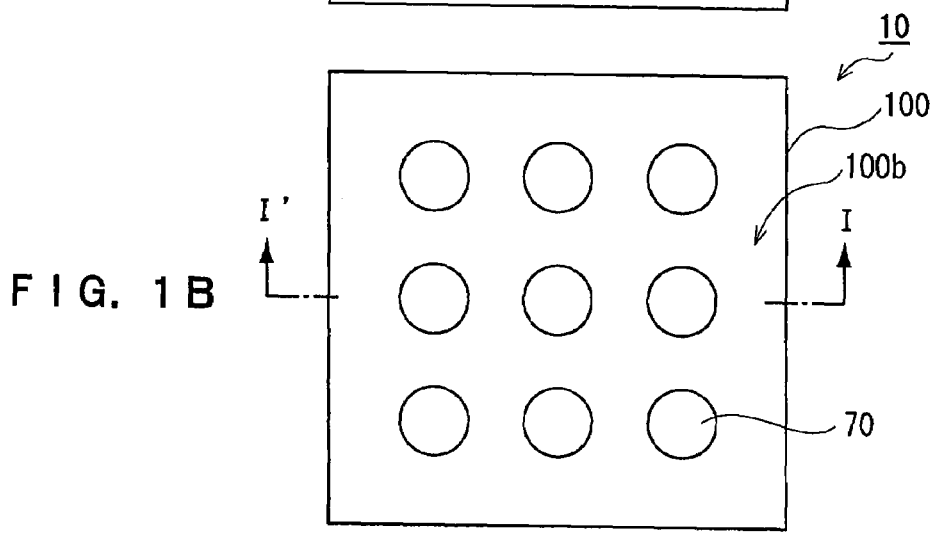
FIG. 1B is a schematic plan diagram showing the semiconductor device as seen from the bottom surface side.
Figure 1C:
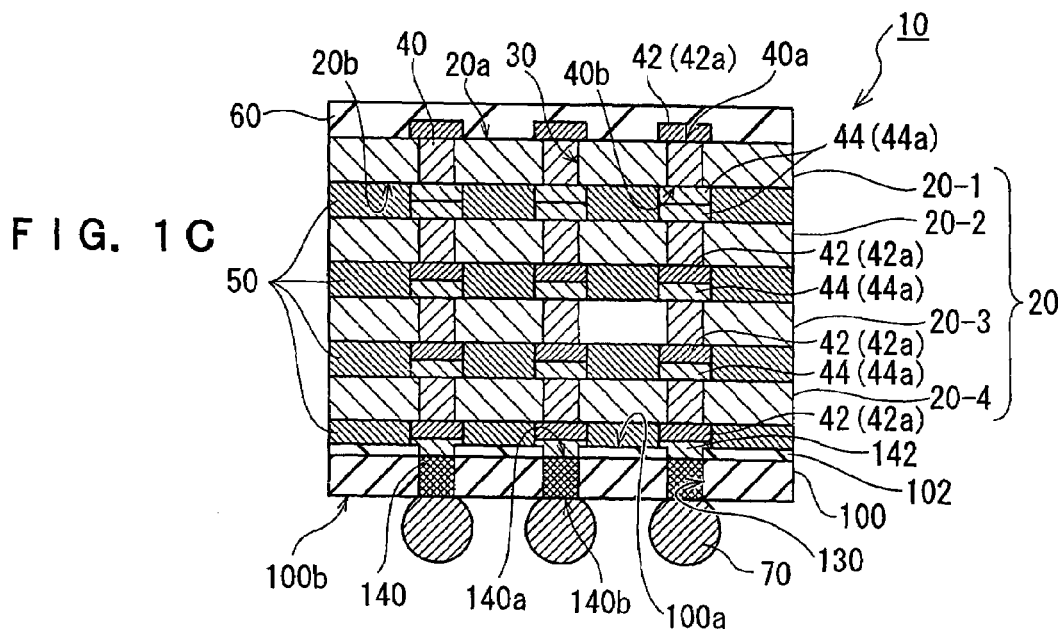
FIG. 1C is a schematic diagram showing a cross section cut by a one-dotted broken line represented by I-I' in FIG. 1A and FIG. 1B.

FIG. 1A is a schematic plan diagram showing a semiconductor device 10 as seen from the top surface side. FIG. 1B is a schematic plan diagram showing the semiconductor device 10 as seen from the bottom surface side. FIG. 1C is a schematic diagram showing a cross section cut by a one-dotted broken line represented by I-I' in FIG. 1A and FIG. 1B.

The semiconductor device 10 includes a mounting substrate 100. The mounting substrate 100 is an interposer, for example. The mounting substrate 100 is shaped like a rectangular parallelepiped overall and includes a front surface 100a and a back surface 100b that opposes the front surface 100a.

An insulating film 102 comprising a silicon oxide film, a silicon nitride film, or a polyimide film, for example, is disposed on the front surface 100a.

The mounting substrate 100 includes plural mounting substrate through holes 130 that open to the insulating film 102 from the front surface 100a to the back surface 100b. The mounting substrate through holes 130 correspond to positions where external terminals are disposed, and in this example, are disposed in a matrix in an arrangement of 3×3.

A conductive material such as aluminium, copper, tungsten, gold, silver, or polysilicon is embedded in the mounting substrate through holes 130 to form mounting substrate embedded electrodes 140. First top surfaces 140a of the mounting substrate embedded electrodes 140 are exposed from the front surface of the insulating film 102. Further, second top surfaces 140b of the mounting substrate embedded electrodes 140 are exposed from the back surface 100b.

A mounting substrate first wiring layer 142 is disposed on the insulating film 102. The mounting substrate first wiring layer 142 includes plural wires. The wires include wires electrically connected to the first top surfaces 140a of the mounting substrate embedded electrodes 140. In this example, as some of the wires, mounting substrate bumps comprising a material such as Sn—Ag, Sn—Pb, copper, aluminium, or nickel are disposed directly on the first top surfaces 140a.

External terminals 70 are mounted on the exposed second top surfaces 140b. The external terminals 70 are solder balls comprising an alloy of Sn—Pb or Sn—Ag.

Plural semiconductor chips 20 are mounted (laminated) on the front surface 100a side of the mounting substrate 100. In this example, four semiconductor chips 20 (a first semiconductor chip 20-1, a second semiconductor chip 20-2, a third semiconductor chip 20-3, and a fourth semiconductor chip 20-4) are laminated. Below, sometimes these plurally laminated semiconductor chips will be collectively referred to as a chip laminate.

Similar to the mounting substrate 100, each of the semiconductor chips 20 is shaped liked a rectangular parallelepiped overall and includes a first main surface 20a and a second main surface 20b that opposes the first main surface 20a.

Each of the semiconductor chips 20 includes plural through holes 30 from the first main surface 20a to the second main surface 20b. The through holes 30 correspond to positions where external terminals are disposed—that is, positions where mounting substrate bumps (142) of the mounting substrate 100 are disposed—and in this example, are disposed in a matrix in an arrangement of 3×3.

A conductive material such as aluminium, copper, tungsten, gold, silver, or polysilicon is embedded in the through holes 30 to form embedded electrodes 40. First top surfaces 40a of the embedded electrodes 40 are exposed from the first main surfaces 20a. Further, second top surfaces 40b of the embedded electrodes 40 are exposed from the second main surfaces 20b.

A first wiring layer 42 is disposed on the first main surface 20a of each of the semiconductor chips 20. Each of the first wiring layers 42 includes plural wires. The wires include wires electrically connected to the first top surfaces 40a of the embedded electrodes 40. In this example, as some of the wires, first bumps 42a comprising a material such as Sn—Ag, Sn—Pb, copper, aluminium, or nickel are disposed directly on the first top surfaces 40a.

Further, a second wiring layer 44 is disposed on the second main surface 20b of each of the semiconductor chips 20. Each of the second wiring layers 44 includes plural wires. The wires include wires electrically connected to the second top surfaces 40b of the embedded electrodes 40. In this example, as some of the wires, second bumps 44a comprising a material such as Sn—Ag, Sn—Pb, copper, aluminium, or nickel are disposed directly on the second top surfaces 40b.

The second bumps 44a of the second semiconductor chip 20-2 are electrically connected to the second bumps 44a of the first semiconductor chip 20-1. That is, these bumps are interconnected, and the second semiconductor chip 20-2 is mounted on the first semiconductor chip 20-1.

The second bumps 44a of the third semiconductor chip 20-3 are electrically connected to the first bumps 42a of the second semiconductor chip 20-2. That is, these bumps are interconnected, and the third semiconductor chip 20-3 is mounted on the laminate of the first semiconductor chip 20-1 and the second semiconductor chip 20-2.

The second bumps 44a of the fourth semiconductor chip 20-4 are electrically connected to the first bumps 42a of the third semiconductor chip 20-3. That is, these bumps are interconnected, and the fourth semiconductor chip 20-4 is mounted on the laminate of the first semiconductor chip 20-1, the second semiconductor chip 20-2, and the third semiconductor chip 20-3.

The first bumps 42a of the fourth semiconductor chip 20-4 are electrically connected to the mounting substrate bumps 142 of the mounting substrate 100. In this manner, the fourth semiconductor chip 20-4—that is, the chip laminate—is mounted on the mounting substrate 100.

It will be noted that these plural semiconductor chips 20 may all have the same function or may have respectively different functions.

Further, in the drawings, an example is shown where the first bumps 42a and the second bumps 44a are arranged in a straight line along the extension direction of the penetration electrodes—that is, the embedded electrodes 40—but the bumps are not limited to this and can also be arranged in arbitrary positions via the first and second wiring layers 42 and 44 in a range where bonding and electrical conductivity are possible.

The gap between the first semiconductor chip 20-1 and the second semiconductor chip 20-2, the gap between the second semiconductor chip 20-2 and the third semiconductor chip 20-3, the gap between the third semiconductor chip 20-3 and the fourth semiconductor chip 20-4, and the gap between the fourth semiconductor chip 20-4 and the mounting substrate 100 are filled and sealed with a first sealing portion (underfill portion) 50 (also simply called sealing portion).

For the first sealing portion 50, it is preferable to use an epoxy thermosetting resin that either includes silica particles, for example, as filler or does not include filler when consideration is given to sealing narrower gaps.

A second sealing portion (mold sealing portion) 60 (also simply called sealing portion) comprising epoxy that is a mold resin material is disposed on the uppermost surface of the chip laminate—that is, the first main surface 20a of the first semiconductor substrate 20-1 and the first bumps 42a disposed on the first main surface 20a.

(Semiconductor Device Fabricating Method)

A method of fabricating the semiconductor device of the present invention having the above-described configuration will be described with reference to FIG. 2 to FIG. 10. It will be noted that, similar to FIG. 1C, each of these drawings is a schematic diagram showing a cross section cut at a position bisecting embedded electrodes.

Figure 4:
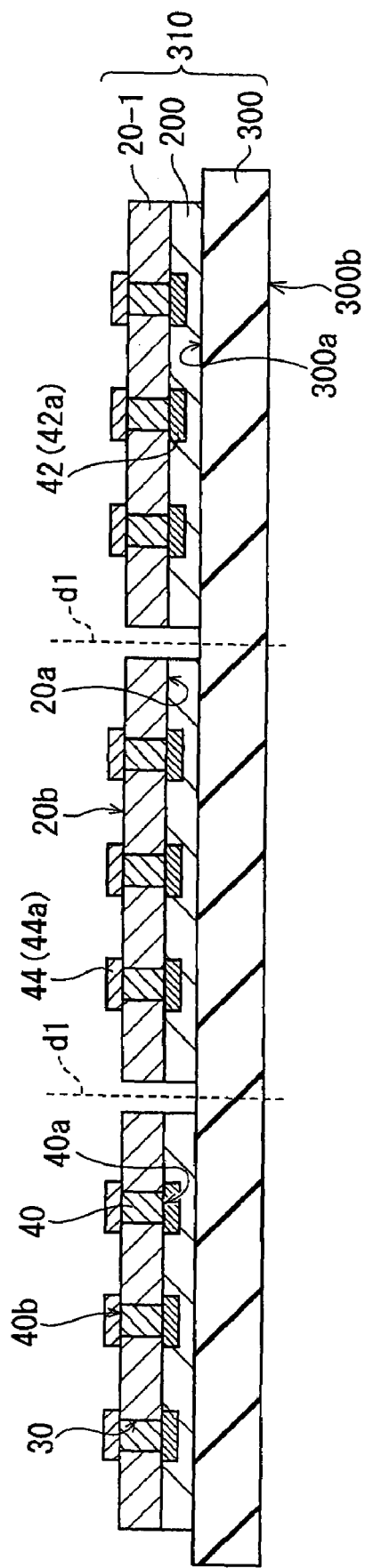
FIG. 4 is a schematic diagram showing the cross section of the structure during fabrication.

FIG. 2, FIG. 3, and FIG. 4 are schematic diagrams showing the cross section of a structure during fabrication.

Figure 5:
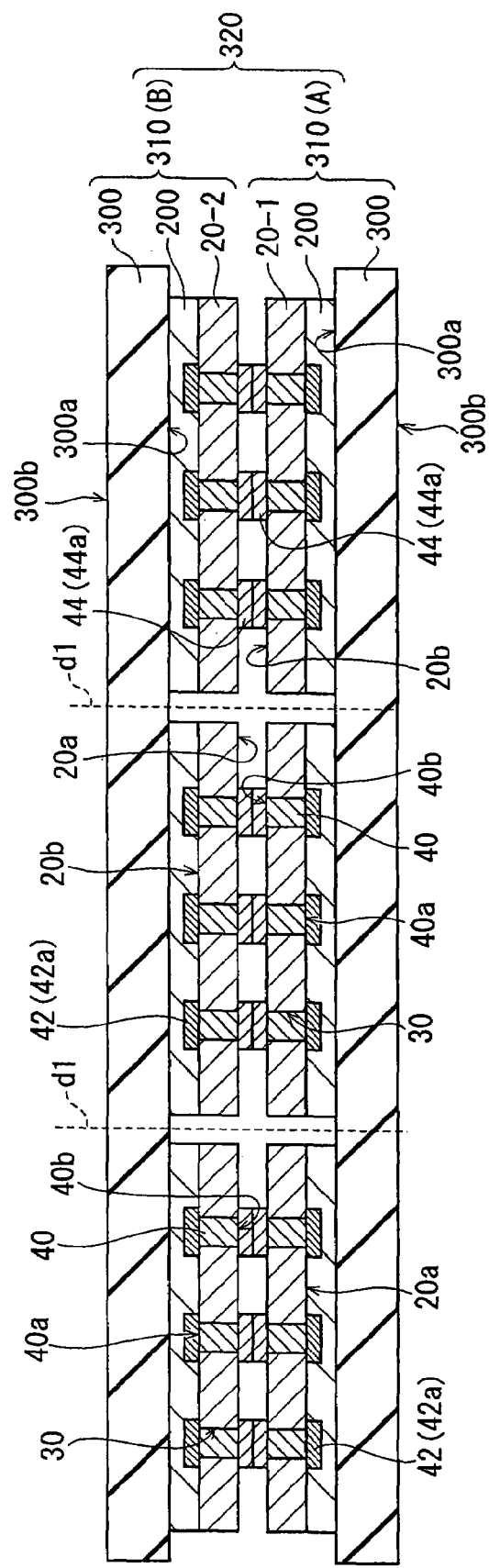
FIG. 5 is a schematic diagram showing the cross section of the structure during fabrication continued from FIG. 4.
Figure 6:
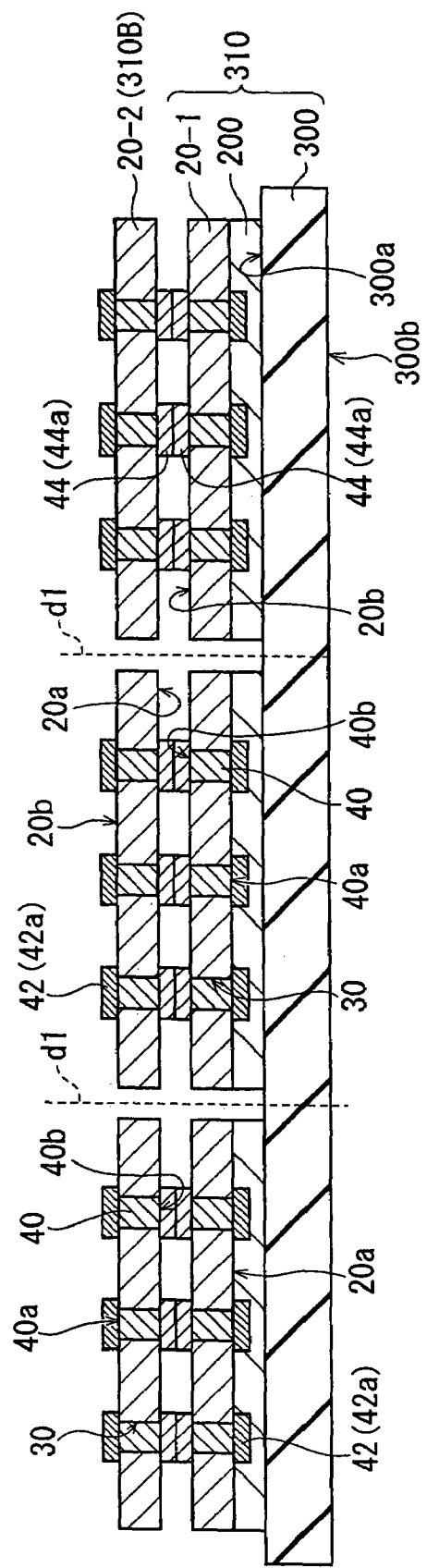
FIG. 6 is a schematic diagram showing the cross section of the structure during fabrication continued from FIG. 5.

FIG. 5 and FIG. 6 are schematic diagrams showing the cross section of the structure during fabrication continued from FIG. 4.

Figure 7:
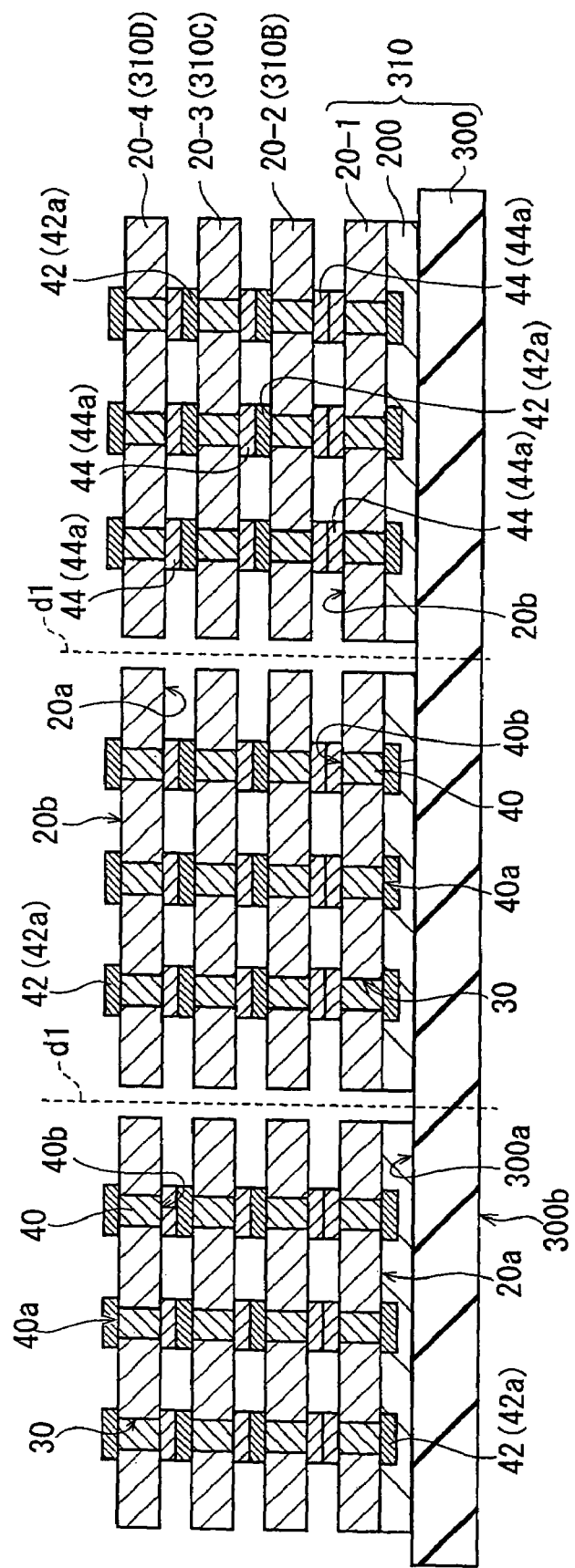
FIG. 7 is a schematic diagram showing the cross section of the structure during fabrication continued from FIG. 6.
Figure 8:
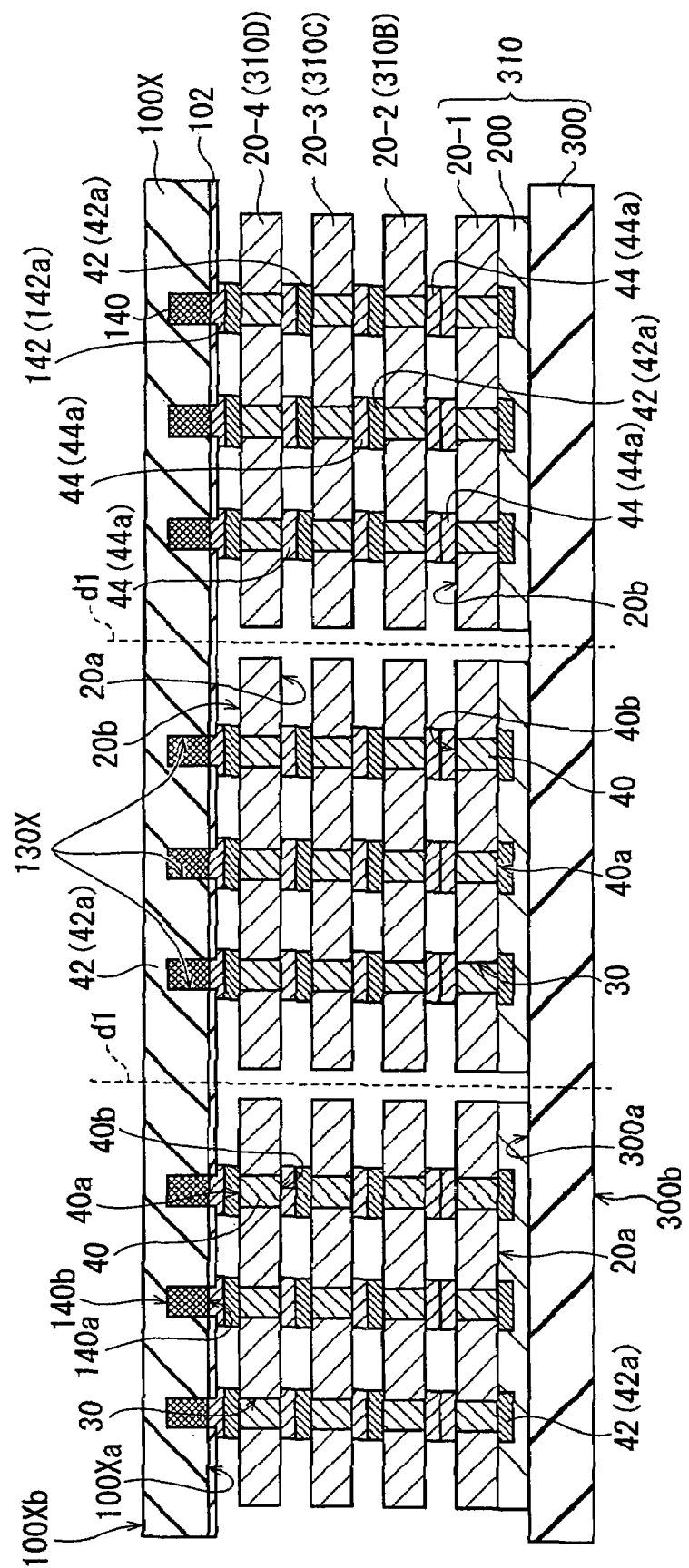
FIG. 8 is a schematic diagram showing the cross section of the structure during fabrication continued from FIG. 7.

FIG. 7 and FIG. 8 are schematic diagrams showing the cross section of the structure during fabrication continued from FIG. 6.

Figure 9A:
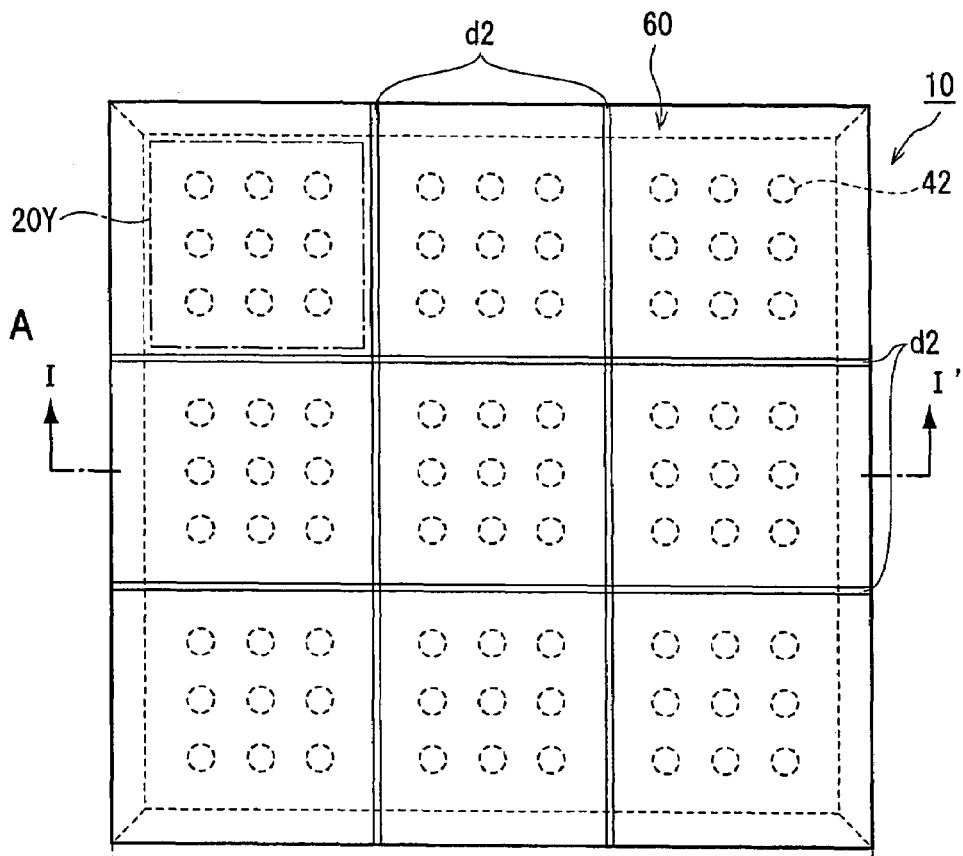
FIG. 9A is a schematic diagram, seen planarly from the side, of the top surface of the structure during fabrication continued from FIG. 8.
Figure 9B:
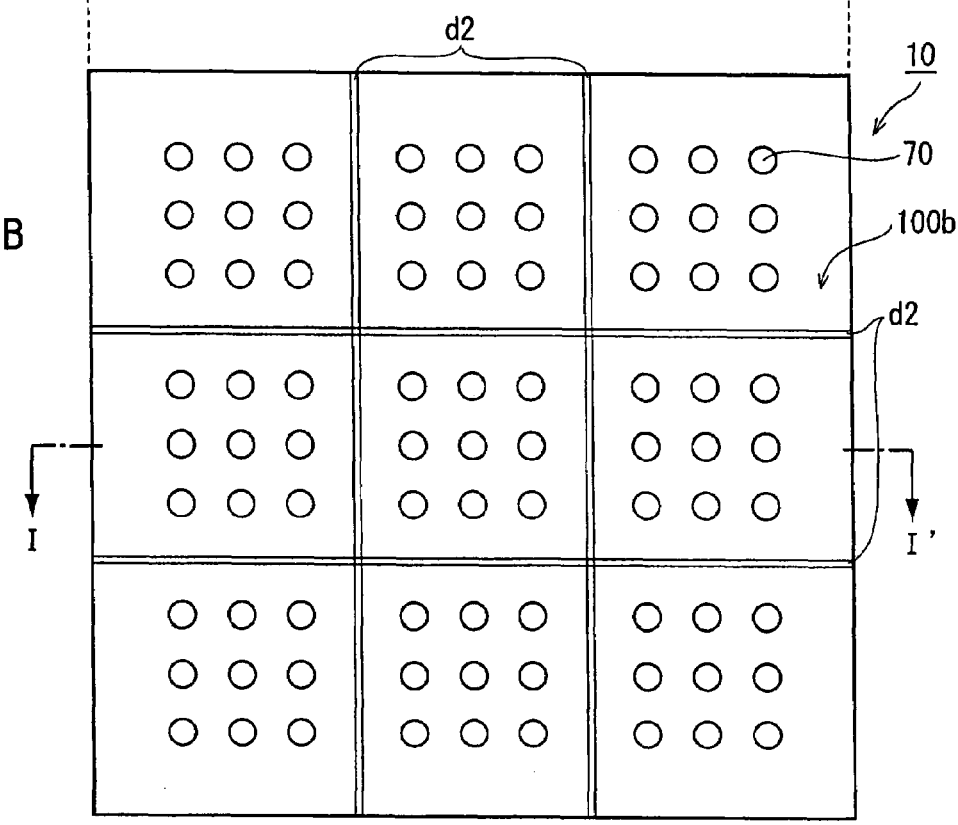
FIG. 9B is a schematic diagram, seen planarly from the side, of the bottom surface of the structure during fabrication continued from FIG. 8.

FIG. 9A and FIG. 9B are schematic diagrams, seen planarly from the side, of the top surface (FIG. 9A) and the bottom surface (FIG. 9B) of the structure during fabrication continued from FIG. 8.

Figure 10:
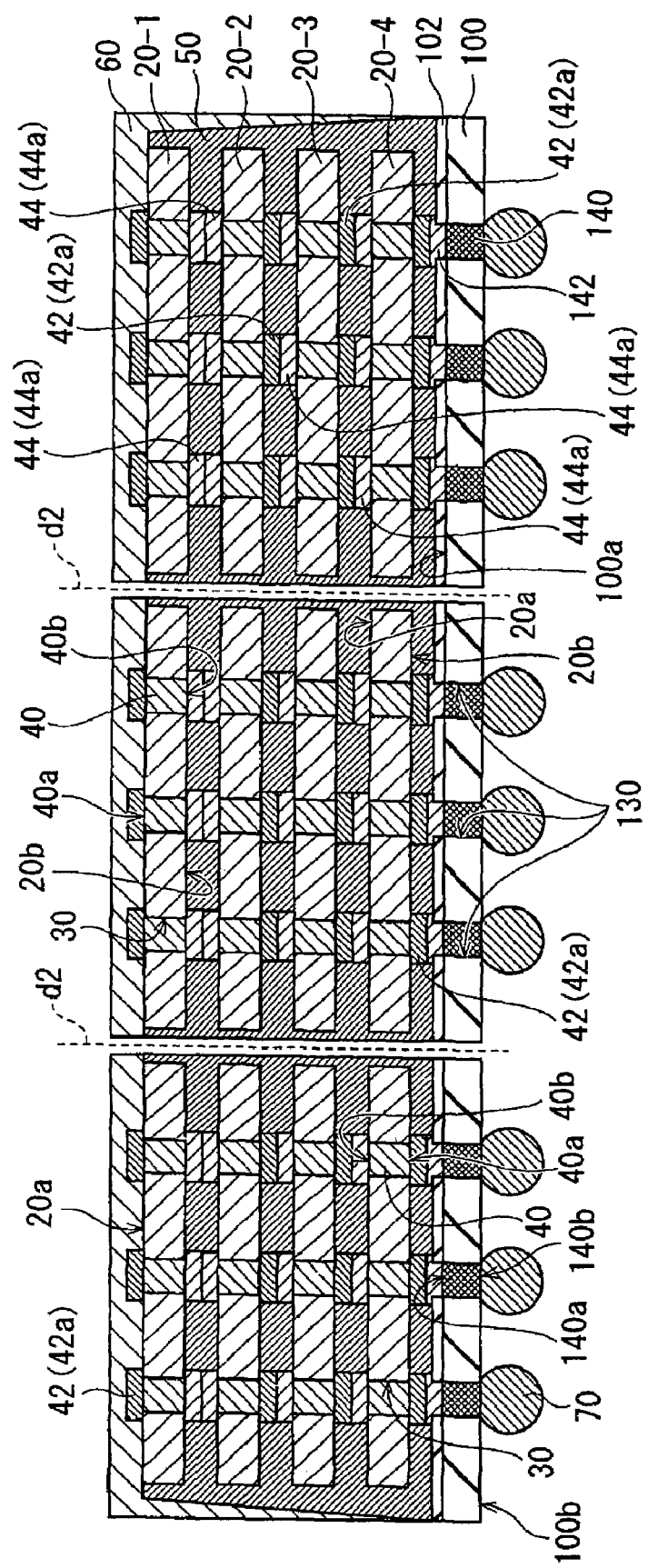
FIG. 10 is a schematic diagram showing a cross section cut at a position represented by one-dotted chain line I-I' in FIG. 9A and FIG. 9B.

FIG. 10 is a schematic diagram showing a cross section cut at a position represented by one-dotted chain line I-I' in FIG. 9A and FIG. 9B.

As shown in FIG. 2, first, plural semiconductor wafers 20X whose wafer process has ended are prepared. Each of the semiconductor wafers 20X includes a first main surface 20Xa and a second main surface 20Xb that opposes the first main surface 20Xa.

Each of the semiconductor wafers 20X includes plural chip regions 20Y set in a matrix on the first main surface 20Xa side, and various function elements are formed by a wafer process and disposed inside the chip regions 20Y.

Precursor through holes 30X are disposed in the first main surface 20Xa inside the chip regions 20Y It will be noted that the precursor through holes 30X do not reach the second main surface 20Xb.

The previously described conductive material is embedded in the precursor through holes 30X in accordance with a common method to form the embedded electrodes 40. The height of the embedded electrodes 40 in the thickness direction of the semiconductor wafer 20X is in the range of 50 μm to 100 μm, for example.

The first top surfaces 40a of the embedded electrodes 40 are exposed to the first main surface 20Xa. The second top surfaces 40b are present inside the semiconductor wafer 20X.

Plural wires included in the first wiring layers 42 (the first bumps 42a) extend on the first main surface 20Xa inside the chip regions 20Y.

Wires electrically connected to the first top surfaces 40a of the embedded electrodes 40 are included in these wires.

The semiconductor wafer 20X having this configuration is mounted on a support substrate 300. The support substrate 300 is a flat plate-shaped body that includes a front surface 300a and a back surface 300b that opposes the front surface 300a. The support substrate 300 preferably comprises a glass substrate whose thickness is in the range of about 0.5 mm to about 1.0 mm, for example.

Because a glass substrate has high planarity and is also resistant to heat, it can effectively prevent warpage and breakage of semiconductor wafers or semiconductor chips even after steps requiring heating, such as a later-described bump forming step, are performed.

The first main surface 20Xa of the semiconductor wafer 20X and the first wiring layers 42 are made to face the front surface 300a of the support substrate 300 and are adhered thereto using a conventionally known adhesive 200 such as a UV-curable or heat-curable adhesive. The adhesive 200 is preferably disposed in the range of about 20 μm to about 100 μm, for example.

The formed laminate structure is also called a precursor support substrate laminate 310X. In this manner, plural precursor support substrate laminates 310X having the same configuration are prepared.

It will be noted that the following steps are actually performed with respect to the plural precursor support substrate laminates 310X.

As shown in FIG. 3, next, the second main surface 20Xb side of the semiconductor wafer 20X that the precursor support substrate laminate 310X includes is polished. This polishing step can be implemented in accordance with a common method by mechanical polishing using a conventionally known whetstone or by chemical mechanical polishing, for example.

Due to this polishing step, the second top surfaces 40b of the embedded electrodes 40 are exposed to the polished second main surface 20Xb.

Next, the second wiring layers 44 are formed on the second main surface 20Xb by a conventionally known process that is the same as the process of forming rewiring layers of a W-CSP, for example. In addition, the second bumps 44a are formed in accordance with a common method by electroplating, for example.

Some of the plural wires that the second wiring layers 44 include are disposed electrically connected to the second top surfaces 40b of the embedded electrodes 40.

As shown in FIG. 4, the semiconductor wafer 20X that the precursor support substrate laminate 310X includes is cut along boundary lines of the plural chip regions 20Y in accordance with a common method using a conventionally known dicing apparatus. Dicing lines in this dicing step and groove portions formed by the dicing step are indicated by "d1".

At this time, polishing is performed with a dicing blade to the extent that the adhesive 200 is exposed, that is, without cutting the support substrate 300. But it is alright even if the support substrate 300 is slit a little in a range that does compromise the purpose of the present invention.

Due to this step, the semiconductor wafer 20X is diced into plural semiconductor chips 20, and the precursor support substrate laminate 310X becomes a support substrate laminate 310 that includes the plural semiconductor chips 20.

In this manner, because the thinning and dicing step resulting from polishing the semiconductor wafer 20X is performed in a state where the semiconductor wafer 20X is laminated on the support substrate 300, drawbacks such as warpage and breakage of the semiconductor chips can be effectively prevented.

As shown in FIG. 5, two of the support substrate laminates 310—that is, a first support substrate laminate 310A and a second support substrate laminate 310B—are made to face each other, and their second wiring layers 44 are electrically interconnected—that is, their second bumps 44a are bonded and electrically connected to each other and laminated in accordance with a common method. This state is also called a support substrate laminate composite 320.

As shown in FIG. 6, next, one of the support substrates 300 of the two support substrates 300 of the support substrate laminate composite 320 (in this example, the support substrate 300 of the second support substrate laminate 310B) is separated and removed by a method corresponding to the material selected for the adhesive 200 to expose the first wiring layers 42 (the first bumps 42a).

In the following description, for the ease of description, support substrate laminates whose support substrate 300 has been separated and removed will be described by adding a reference numeral such as "third support substrate laminate 310C".

Next, the second wiring layer (44) side of another support substrate laminate (third support substrate laminate 310C) is made to face the exposed first wiring layers 42 (the first bumps 42a), and the second wiring layers (the second bumps) are bonded, electrically connected, and laminated.

Moreover, the support substrate (300) of the third support substrate laminate 310C is separated by removing the adhering adhesive 200 to expose the first wiring layers 42 (the first bumps 42a).

As shown in FIG. 7, the second wiring layer (44) side of another support substrate laminate (a fourth support substrate laminate 310D) is made to face the first wiring layers 42 (the first bumps 42a) of the exposed third support substrate laminate 310C, and the second wiring layers (the second bumps) are bonded, electrically connected, and laminated.

Moreover, the support substrate (300) of the fourth support substrate laminate 310D is separated by removing the adhering adhesive 200 to expose the first wiring layers 42 (the first bumps 42a).

In this manner, the step of bonding and mounting the second bumps 44a of the support substrate laminates 310 to the first bumps 42a exposed by separating and removing the support substrates 300 from the support substrate laminate composite 320 is repeated an arbitrary number of times such as one or two or more times, so that the desired number of semiconductor chips 20 can be laminated in their thickness direction in a state where, in this example, their end edges demarcating the planar shapes of the semiconductor chips 20 are aligned. The structure comprising plural semiconductor chips that have been laminated in this manner is also called a laminate structure.

Further, plural semiconductor chips can also be laminated in a state where they have been mutually shifted in the main surface direction of the semiconductor chips 20, for example.

By performing the laminating step in this manner, the laminating step can be performed sequentially in a state where the semiconductor chips 20 have been mounted on the support substrates 300, so that the occurrence of warpage and breakage of the semiconductor chips 20 can be effectively prevented. Further, bonding can be more precisely performed because it becomes easier to maintain the planarity of the semiconductor chips 20 in a state where they have been mounted on the support substrates 300. Consequently, the fabrication yield can be improved even more.

Next, as shown in FIG. 8, a precursor mounting substrate 100X is bonded to and mounted on the exposed first wiring layers 42 (the first bumps 42a) of the fourth support substrate laminate 310D.

The precursor mounting substrate 100X is shaped like a rectangular parallelepiped overall and includes a front surface 100Xa and a back surface 100Xb that opposes the front surface 100Xa.

An insulating layer 102 comprising a silicon oxide film, a silicon nitride film, or a polyimide film, for example, is disposed on the front surface 100Xa.

Precursor mounting substrate through holes 130X are disposed in the precursor mounting substrate 100X so as to open to the front surface 100Xa. It will be noted that the precursor mounting substrate through holes 130X do not reach the back surface 100Xb.

The previously described conductive material, such as aluminium, copper, tungsten, gold, silver, or polysilicon, for example, is embedded in the precursor mounting substrate through holes 130X in accordance with a common method to form the mounting substrate embedded electrodes 140.

The first top surfaces 140a of the mounting substrate embedded electrodes 140 are exposed to the front surface 100Xa. The second top surfaces 140b are present inside the precursor mounting substrate 100X.

The insulating film 102 is disposed on the front surface 100Xa. Plural wires included in the mounting substrate first wiring layers 142 (the mounting substrate bumps 142a) extend on the insulating film 102.

Wires electrically connected to the first top surfaces 140a of the mounting substrate embedded electrodes 140 are included in these wires. In this example, as some of the wires, mounting substrate bumps 142a comprising a material such as Sn—Ag, Sn—Pb, copper, aluminium, or nickel are disposed directly on the first top surfaces 140a.

Due to this step, the mounting substrate embedded electrodes 140 of the precursor mounting substrate 100X—that is, the mounting substrate first wiring layers 142—are electrically connected to the exposed first wiring layers 142 of the fourth support substrate laminate 310D.

Next, the support substrate 300 of the first support substrate laminate 310A is separated and removed to expose the first wiring layers 42.

As shown in FIG. 9A, FIG. 9B, and FIG. 10, the first sealing portion 50 is formed by applying the previously described material.

The step of forming the first sealing portion 50 is performed so as to expose—that is, not seal—the exposed first wiring layers 42 and so as to seal the gaps between the plural semiconductor chips 20 and the gap between the semiconductor chip 20 and the precursor mounting substrate 100X.

The sealing step is preferably performed by injecting the previously described underfill resin material from the sides of the semiconductor chips 20 configuring the laminate—that is, from the end edge sides of the mounting substrate—and into the groove portions d1 formed by dicing.

By injecting the underfill resin material from plural places in this manner, the sealing step can be executed more efficiently and reliably.

Further, the step of forming the first sealing portion 50 may be one where supply and temporary curing of resin material is performed during each step of sequentially laminating the support substrate laminates and where the resin material is completely cured at the stage where the laminating step and each sealing step have ended.

Next, the second sealing portion 60 is formed. The second sealing portion 60 is formed so as to seal the exposed first wiring layers 42 and the first sealing portion 50.

The step of forming the second sealing portion 60 may be implemented in accordance with a common method by transfer molding using a mold.

Next, the back surface 100Xb side of the precursor mounting substrate 100X is mechanically polished using a whetstone, for example, to expose the second top surfaces 140b of the mounting substrate embedded electrodes 140.

In this manner, the thinning step resulting from polishing the precursor mounting substrate 100X is performed in a state where the plural semiconductor chips have been laminated and resin-sealed, so that drawbacks such as breakage of the precursor mounting substrate 100X can be effectively prevented without having to prepare a support substrate.

Moreover, the external terminals 70 comprising solder balls, for example, are mounted and formed on the second top surfaces 140b of the exposed mounting substrate embedded electrodes 140 in accordance with a common method. The external terminals 70 can be given an arbitrary preferable arrangement depending on the specifications or the like. In this example, the external terminals have a ball grid array (BGA) arrangement where solder balls are arranged in a 3×3 matrix inside the chip regions.

Finally, dicing is performed along the boundary lines of the plural chip regions—that is, along dicing lines d2. Due to this step, plural, and in this example nine, semiconductor devices 10 are completed.

Second Embodiment

Another example of the method of fabricating the semiconductor device of the present invention having the above-described configuration will be described with reference to FIG. 11 to FIG. 14. It will be noted that, similar to FIG. 1C, each of these drawings is a schematic diagram showing a cross section cut at a position bisecting embedded electrodes.

The configuration of the semiconductor device to be fabricated is not different from the example configuration previously described in the first embodiment, so description thereof will be omitted.

Figure 11:
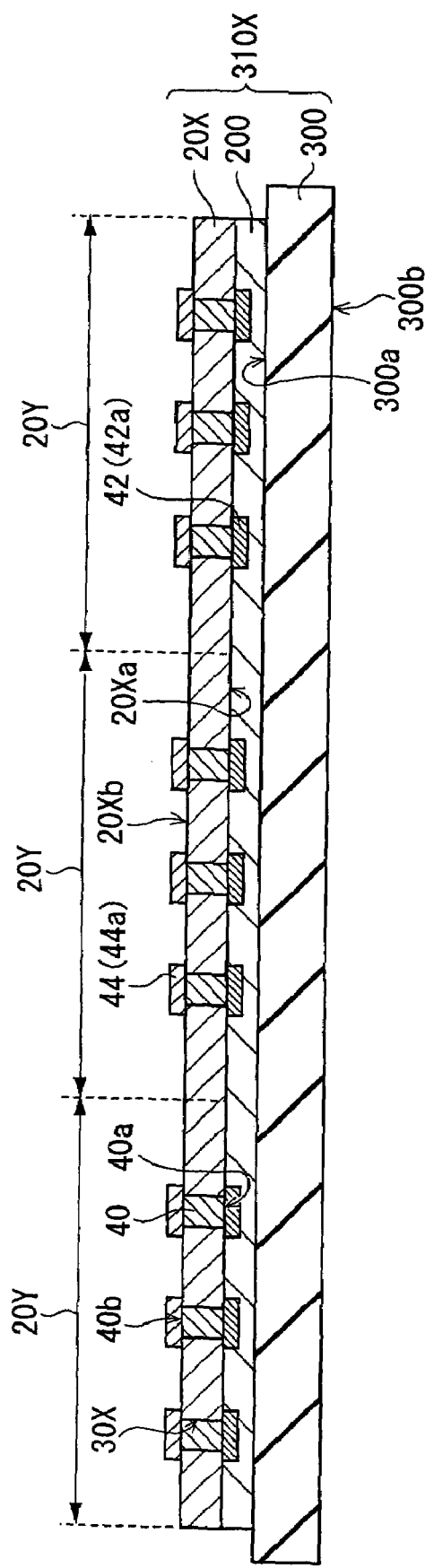
FIG. 11 is a schematic diagram showing the cross section of a structure during fabrication.
Figure 12:
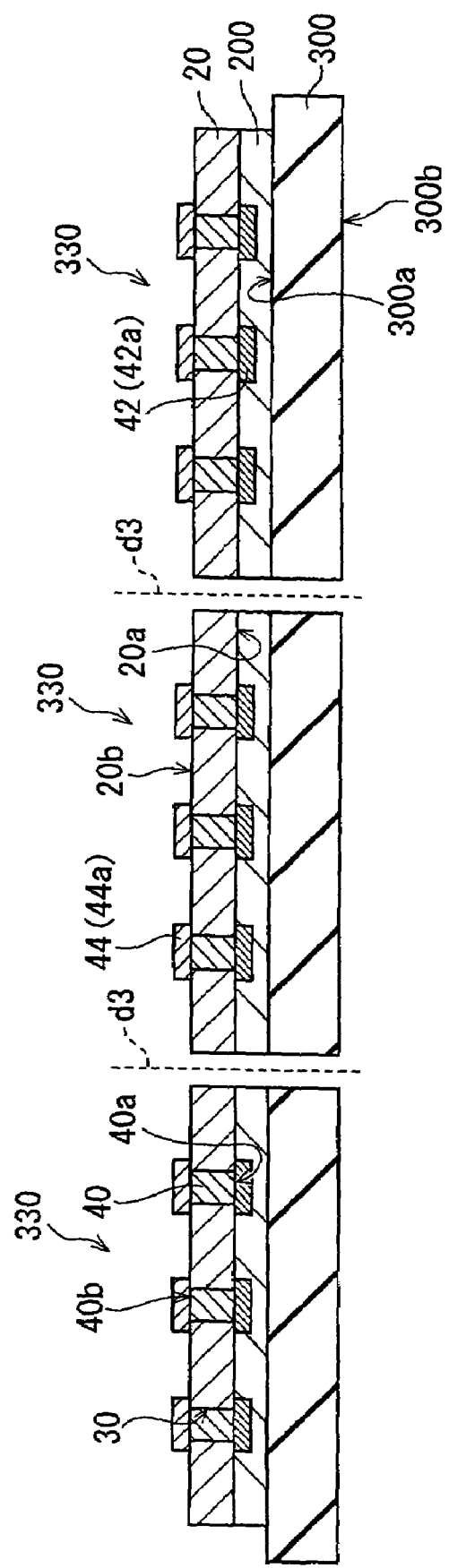
FIG. 12 is a schematic diagram showing the cross section of the structure during fabrication.

FIG. 11 and FIG. 12 are schematic diagrams showing the cross section of a structure during fabrication.

Figure 13:
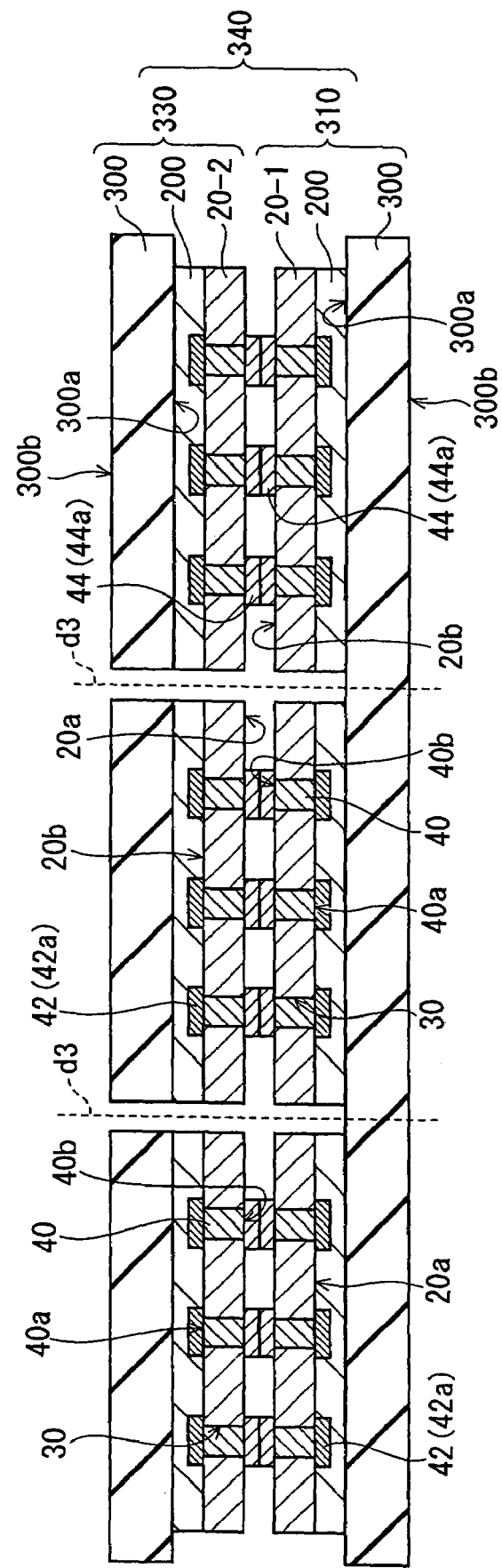
FIG. 13 is a schematic diagram showing the cross section of the structure during fabrication continued from FIG. 12.
Figure 14:
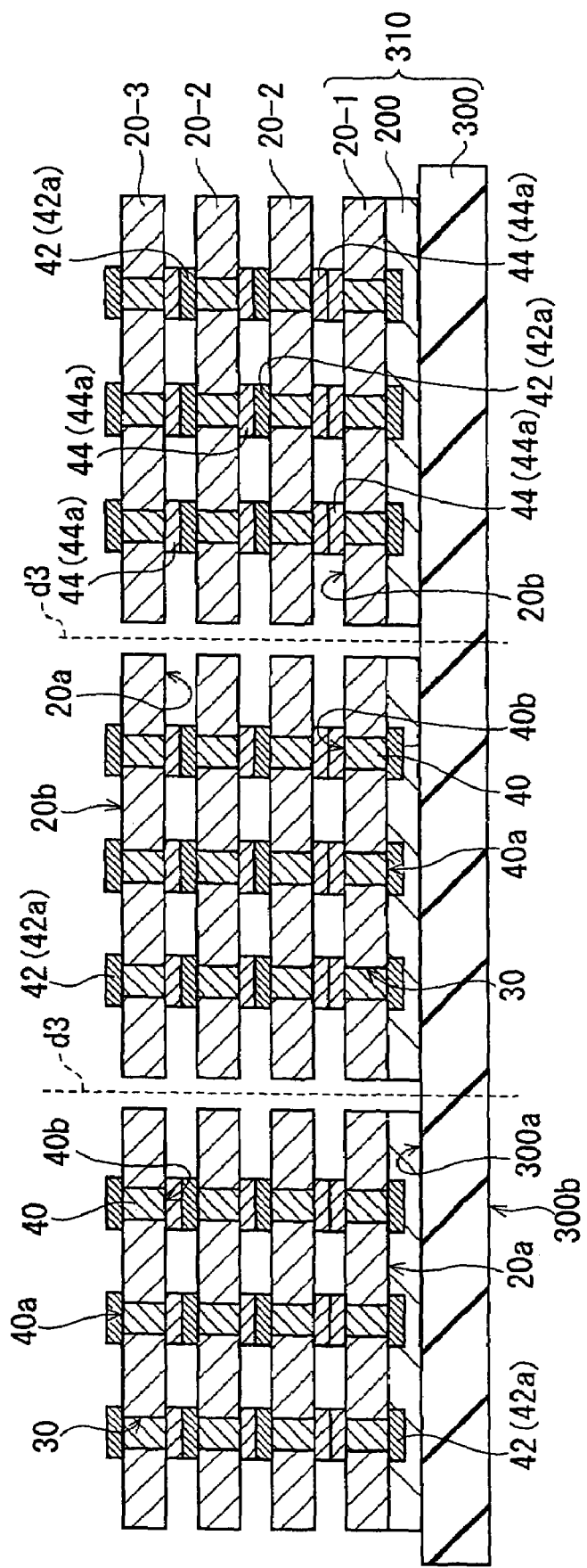
FIG. 14 is a schematic diagram showing the cross section of the structure during fabrication continued from FIG. 13.

FIG. 13 and FIG. 14 are schematic diagrams showing the cross section of the structure during fabrication continued from FIG. 12.

As shown particularly in FIG. 12, the semiconductor device fabricating method of this example is characterized in that it uses the precursor support substrate laminate 310X previously described in the first embodiment and, apart from this, plural divided substrate laminates 330 resulting from the support substrate laminate 310X being divided by dicing lines (groove portions) d3.

The steps other than this are not different from the fabrication steps described in the first embodiment, so the same numerals will be used for the same configurations and detailed description of the same steps will be omitted unless otherwise noted.

First, plural support substrate laminates 310 are prepared in the same manner as in the previously described first embodiment.

Next, as shown in FIG. 12, some of these plural precursor support substrate laminates 310X are divided into plural divided substrate laminates 330.

This dividing step is performed along the dicing lines d3 set along the boundaries of the chip regions 20Y using a conventionally known dicing apparatus.

This dicing is performed by cutting the semiconductor wafer 20X, the adhesive 200, and the support substrate 300.

Each of the divided substrate laminates 330 may be one that includes just one semiconductor chip 20 or may be one where plural semiconductor chips 20 are continuous in an uncut state. Specifically, as shown in FIG. 5, for example, the boundary lines (dicing lines) of the chip regions 20Y set in a matrix—that is, in two directions—may be cut in just one direction to form a laminate in a state where three semiconductor chips (20) are continuous. In this case, the dicing step may be again performed at the same timing as in the first embodiment to dice the semiconductor chips 20.

Next, as shown in FIG. 13, the plural divided substrate laminates 330 are mounted on a support substrate laminate 310.

The following steps are substantially the same as those in the first embodiment, so just the essentials will be described.

The precursor support substrate laminate 310X and the plural divided substrate laminates 330 are made to face each other, and the second wiring layers 44 are electrically interconnected—that is, the second bumps 44a are bonded, electrically connected, and laminated in accordance with a common method—to form a support substrate laminate composite 340.

Next, the divided support substrates 300 of the divided substrate laminates 330 are separated and removed to expose the first wiring layers 42 (the first bumps 42a).

Next, the second wiring layers (44) of the plural divided substrate laminates 330 are made to face the exposed first wiring layers 42 (the first bumps 42a), and the second wiring layers (the second bumps) are bonded, electrically connected, and laminated.

Moreover, the divided support substrates 300 of the divided substrate laminates 330 are separated and removed to expose the first wiring layers 42 (the first bumps 42a).

Moreover, the second wiring layers (44) of another divided support substrate laminate 330 are made to face the exposed first wiring layers 42 (the first bumps 42a), and the second wiring layers (the second bumps) are bonded, electrically connected, and laminated.

Moreover, the support substrate 300 is separated by removing the adhering adhesive 200 to expose the first wiring layers 42 (the first bumps 42a).

In this manner, the step of bonding and mounting the second bumps 44a of the divided substrate laminates 330 to the first bumps 42a exposed by separating and removing the support substrates 300 from the support substrate laminate composite 340 is repeated an arbitrary number of times such as one or two or more times, so that the desired number of semiconductor chips 20 can be laminated in their thickness direction in a state where, in this example, their end edges demarcating the planar shapes of the semiconductor chips 20 are aligned.

In this manner, by performing the laminating step using the divided substrate laminates 330, in addition to the effects previously described in the first embodiment, the semiconductor chips 20 are completed, so that electrical characteristic testing of the semiconductor chips 20 that the divided substrate laminates 330 include can be performed beforehand. Consequently, a divided substrate laminate 330 including a semiconductor chip 20 in which an electrical defect has occurred can be sorted and removed beforehand, so that the yield of the semiconductor devices can be improved even more.

The steps thereafter are not different from the steps of the first embodiment described with reference to FIG. 8 to FIG. 10 excluding the fact that the dicing lines are represented by "d3", so illustration and detailed description thereof will be omitted.

What is claimed is:

1. A semiconductor device fabricating method comprising:
(a) preparing plural semiconductor wafers, each of which includes a first main surface, a second main surface that opposes the first main surface, plural chip regions set in a matrix on the first main surface, precursor through holes that open to the first main surface, embedded electrodes that are embedded in the precursor through holes and include first top surfaces exposed to the first main surface, and first wiring layers that are disposed on the first main surface inside the chip regions and electrically connected to the first top surfaces of the embedded electrodes;
(b) mounting the first main surfaces of the plural semiconductor wafers on front surfaces of plural support substrates, each of which includes a front surface and a back surface that opposes the front surface, and adhering the first main surfaces to the front surfaces with an adhesive to form plural precursor support substrate laminates;
(c) polishing second main surface sides of the precursor support substrate laminates to expose second top surfaces of the embedded electrodes;
(d) forming, on the second main surfaces, second wiring layers disposed electrically connected to the second top surfaces of the embedded electrodes;
(e) cutting the semiconductor wafers along boundary lines of the plural chip regions and polishing, without cutting, the support substrates to form plural support substrate laminates including plural semiconductor chips;
(f) electrically interconnecting and laminating the second wiring layers of two of the support substrate laminates to form a support substrate laminate composite;
(g) separating and removing either one of the support substrates of the two support substrates of the support substrate laminate composite to expose the first wiring layers;
(h) electrically connecting the second wiring layers of the other support substrate laminate to the exposed first wiring layers of the support substrate laminate composite and mounting the second wiring layers on the exposed first wiring layers;

(i) separating and removing either one of the support substrates of the two support substrates of the support substrate laminate composite to expose the first wiring layers;

(j) preparing plural precursor mounting substrates, each of which includes a front surface, a back surface that opposes the front surface, precursor mounting substrate through holes that open to the front surface, and mounting substrate embedded electrodes that are embedded in the precursor mounting substrate through holes and include first top surfaces exposed to the front surface;

(k) electrically connecting the first top surfaces of the mounting substrate embedded electrodes of the precursor mounting substrates to the exposed first wiring layers of the support substrate laminate composite and mounting the first top surfaces on the exposed first wiring layers;

(l) separating and removing the support substrates of the support substrate laminate composite;

(m) exposing the exposed first wiring layers and injecting resin into gaps between the plural semiconductor chips and from end edge sides of the mounting substrate to form a first sealing portion;

(n) forming a second sealing portion that seals the exposed first wiring layers and the first sealing portion;

(o) polishing the back surface sides of the precursor mounting substrates to expose second top surfaces of the mounting substrate embedded electrodes and form a mounting substrate;

(p) forming external terminals on the second top surfaces of the exposed mounting substrate embedded electrodes; and (q) cutting and dicing the first sealing portion, the second sealing portion, and the mounting substrate along boundary lines of the plural chip regions.

2. The semiconductor device fabricating method of claim 1, wherein (h) and (i) are repeatedly performed one or two or more times after (g).

3. The semiconductor device fabricating method of claim 1, wherein the precursor mounting substrates comprise interposers where the height of the mounting substrate embedded electrodes in the thickness direction of the precursor mounting substrates is in the range of 50 μm to 200 μm.

4. The semiconductor device fabricating method of claim 1, wherein the support substrates comprise heat-resistant glass substrates.

5. A semiconductor device fabricating method when fabricating a semiconductor device where plural semiconductor chips are laminated and sealed, the method comprising:

preparing plural semiconductor wafers, each of which includes a first main surface, a second main surface that opposes the first main surface, plural chip regions set in a matrix on the first main surface, precursor through holes that open to the first main surface, embedded electrodes that are embedded in the precursor through holes and include first top surfaces exposed to the first main surface, and first wiring layers that are disposed on the first main surface inside the chip regions and electrically connected to the first top surfaces of the embedded electrodes;

mounting the first main surfaces of the plural semiconductor wafers on front surfaces of plural support substrates, each of which includes a front surface and a back surface that opposes the front surface, and adhering the first main surfaces to the front surfaces with an adhesive to form plural precursor support substrate laminates;

polishing second main surface sides of the precursor support substrate laminates to expose second top surfaces of the embedded electrodes;

forming, on the second main surfaces, second wiring layers disposed electrically connected to the second top surfaces of the embedded electrodes;

cutting the semiconductor wafers along boundary lines of the plural chip regions and polishing, without cutting, the support substrates to form plural support substrate laminates including plural semiconductor chips;

electrically interconnecting and laminating the second wiring layers of two of the support substrate laminates to form a support substrate laminate composite; and separating and removing either of the support substrates of the two support substrates of the support substrate laminate composite to expose the first wiring layers.

* * * * *